(12) United States Patent
Kroll

(10) Patent No.: US 6,655,986 B2
(45) Date of Patent: Dec. 2, 2003

(54) PROXIMITY SWITCH

(75) Inventor: Peter Kroll, Neckartailfingen (DE)

(73) Assignee: Balluff GmbH, Neuhausen (DE)

( * ) Notice: Subject to any disclaimer, the term of this patent is extended or adjusted under 35 U.S.C. 154(b) by 93 days.

(21) Appl. No.: 09/912,018

(22) Filed: Jul. 24, 2001

(65) Prior Publication Data

US 2002/0057199 A1 May 16, 2002

(30) Foreign Application Priority Data

Jul. 25, 2000 (DE) .......................... 100 35 996

(51) Int. Cl.7 .................... H01R 16/62; H05K 5/00
(52) U.S. Cl. ...................................... 439/534; 439/13
(58) Field of Search ............................ 439/11, 13, 534, 439/725, 738, 750

(56) References Cited

U.S. PATENT DOCUMENTS

| 4,785,240 A | * 11/1988 | Newell et al. ............ 439/13 X |
| 5,239,130 A | 8/1993 | Brasse .................... 174/52.1 |
| 5,595,503 A | * 1/1997 | Pittman et al. ........... 439/11 X |
| 5,882,226 A | * 3/1999 | Bell et al. ................ 439/11 X |

FOREIGN PATENT DOCUMENTS

| DE | 41 15 253 | 11/1991 |
| DE | 692 08 628 | 6/1993 |
| DE | 196 18 664 | 10/1997 |

* cited by examiner

*Primary Examiner*—Renee Luebke
(74) *Attorney, Agent, or Firm*—Barry R. Lipsitz; Douglas M. McAllister

(57) ABSTRACT

In order to improve a proximity switch comprising a bearing body with a bearing opening, a sensor head having a proximity sensor with a sensor circuit arranged therein, a bearing attachment piece held on the sensor head and mounted in the bearing opening for rotation about an axis, and a plug connection having a connection side arranged on a side of the bearing attachment piece opposite the sensor head and comprising a connection sleeve and a contact insert arranged in the connection sleeve, such that a plug connector is connectable to the plug connection in a way which in terms of ergonomics is as suitable as possible, it is proposed that the connection sleeve be held non-rotatably in the bearing attachment piece and that the contact insert be mounted in the connection sleeve for rotation relative thereto.

22 Claims, 7 Drawing Sheets

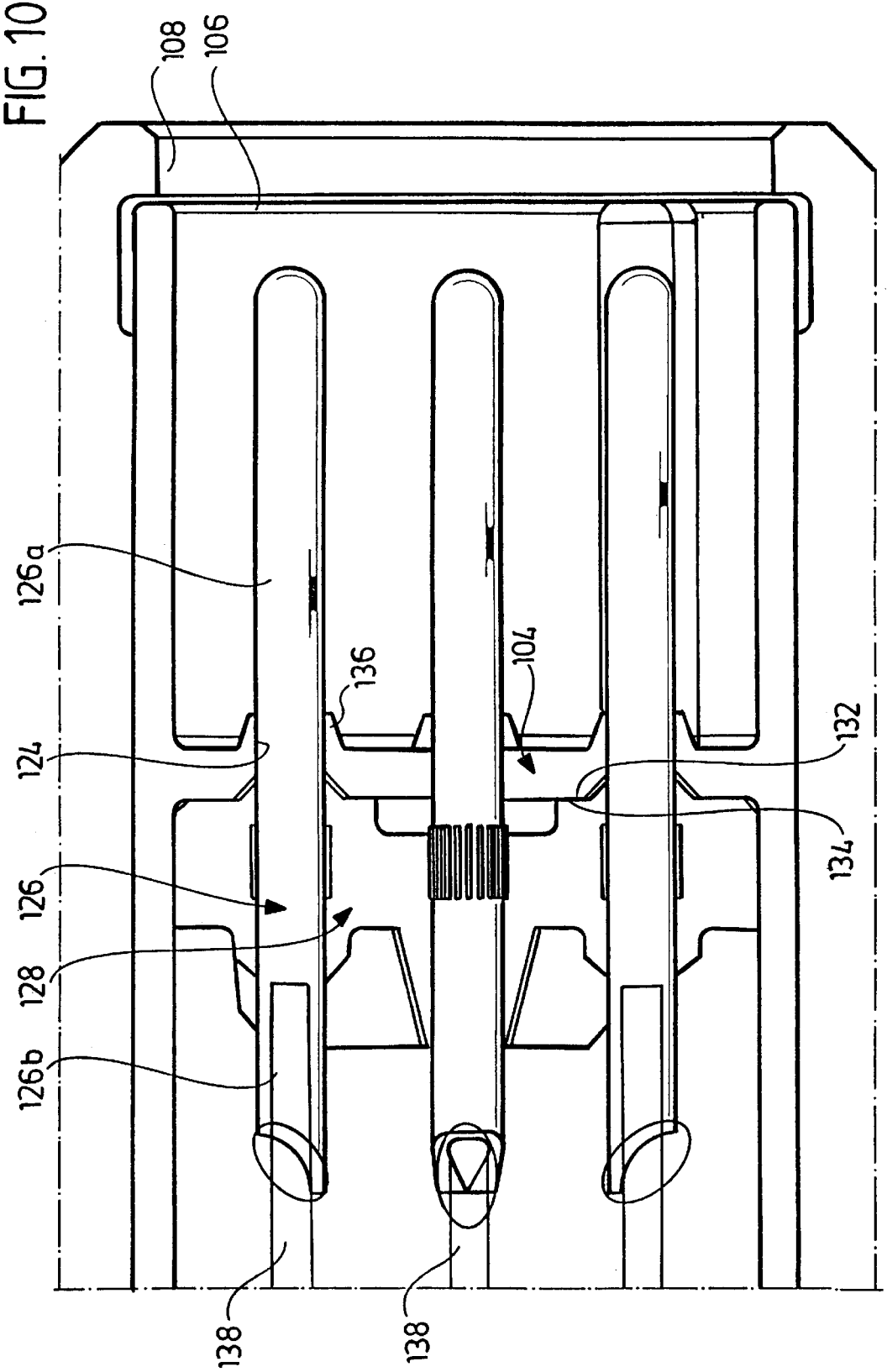

PROXIMITY SWITCH

The present disclosure relates to the subject matter disclosed in application No. 100 35 996.5 of Jul. 25, 2000, which is incorporated herein by reference in its entirety and for all purposes.

BACKGROUND OF THE INVENTION

The invention relates to a proximity switch comprising a bearing body with a bearing opening, a sensor head having a proximity sensor with a sensor circuit arranged therein, a bearing attachment piece held on the sensor head and mounted in the bearing opening for rotation about an axis, and a plug connection having a connection side arranged on a side of the bearing attachment piece opposite the sensor head and comprising a connection sleeve and a contact insert arranged in the connection sleeve.

Such proximity switches are known, for example, from DE 196 18 664. In this solution, the connection sleeve is held rotatably in the bearing attachment piece.

However, such rotatability of the connection sleeve is problematic when screwing on a coupling nut.

The object underlying the invention is therefore to so improve a proximity switch of the generic kind that a plug connector is connectable to the plug connection in a way which in terms of ergonomics is as suitable as possible.

SUMMARY OF THE INVENTION

This object is accomplished in accordance with the invention in a proximity switch of the kind described at the outset in that the connection sleeve is non-rotatably held in the bearing attachment piece, and in that the contact insert is mounted in the connection sleeve for rotation relative thereto.

The advantage of the inventive solution is to be seen in the fact that owing to the rotatability of the contact insert a plug connector connectable to the plug connection can be expediently aligned in an advantageous way. In particular, the alignment of the cable relative to the bearing body is possible in a simple way. On the other hand, it is possible to tighten the coupling nut on the connection sleeve in a simple way without the connection sleeve itself having to be held firmly as the connection sleeve is not rotatable relative to the bearing attachment piece.

In order to prevent turning of the cables leading to the contact insert to too great an extent owing to the rotatability of the contact insert relative to the connection sleeve and hence occurrence of a fault, provision is preferably made for the contact insert to be mounted for limited rotation relative to the connection sleeve.

The contact insert is preferably rotatable through an angle of 360° or less than 360° relative to the connection sleeve.

In the above explanation of the inventive solution no further details were given as to the design of the contact insert.

In a particularly advantageous embodiment, provision is made for the contact insert to comprise a protective sleeve which extends from a contact support in directions opposite to one another. The advantage of such a protective sleeve is to be seen in the fact that a high safety class is thereby achievable in a simple way, i.e., large leakage distances and clearance distances (air distances) and hence high protection against leakage currents (creeping currents).

Provision is preferably made for the protective sleeve to form a plug connection protective section which encloses plug connection sections starting from the contact support.

Furthermore, an advantageous embodiment makes provision for the protective sleeve to comprise a cable connection protective section which encloses cable connection sections.

A particularly advantageous embodiment makes provision for the protective sleeve to extend substantially over the entire extent of the connection sleeve in the direction of the axis.

A particularly expedient design of the protective sleeve, which offers considerable protection against leakage currents, makes provision for the protective sleeve to extend from the sensor head through the bearing attachment piece as far as the connection side. An extensive electrical protection of the electric contacts provided in the contact insert is thereby made possible.

For assembly of a proximity switch according to the invention it has proven particularly expedient for the contact insert to be inserted into the connection sleeve from a side opposite the connection side as a fixing can then be carried out in a simple way from one and the same side.

Provision is preferably made for the contact insert to be supported on the connection sleeve against movement in the direction of the connection side.

Such a supporting of the contact insert is preferably effected via its protective sleeve.

The supporting via the protective sleeve can be implemented via the plug connection protective section and/or via the cable connection protective section of the protective sleeve.

One possibility of fixing the contact insert consists in fixing it in the bearing attachment piece by securing elements such as, for example, a snap ring or a securing pin.

However, a particularly expedient solution makes provision for the contact insert to have a supporting flange which is supported on the sensor head. A particularly simple support against movement in the direction of the sensor head and hence a fixing of the contact insert in the direction of the axis is thereby achievable by the assembly of the sensor head.

The contact insert itself can be implemented in different ways. It is conceivable to anchor contact pins directly in the contact support of the protective sleeve.

The contact support may be removable from the protective sleeve so as to connect cable ends with the cable connection sections of the contact pins.

A particularly expedient solution makes provision for the contact support to be integrally connected to the protective sleeve.

In this case, it is particularly expedient for the contact pins to be held on a contact pin carrier which, in turn, is insertable into the protective sleeve.

To obtain a non-rotatable connection between contact pins and protective sleeve it is particularly expedient for the contact support of the protective sleeve to comprise contact pin openings for passage of the contact pins therethrough.

To ensure a tight closure in the area of the contact pins and the contact pin carrier, the opening of the protective sleeve receiving the contact pin carrier is preferably at least partly cast with molding compound.

A wide range of possibilities is conceivable for implementing the connection sleeve.

For example, it is possible to design the connection sleeve as a part which is integral with the bearing attachment piece. However, a particularly expedient solution makes provision for the connection sleeve to be a separate part inserted into the bearing attachment piece.

In principle, it is also conceivable to insert the connection sleeve into the bearing attachment piece from a side opposite the sensor head. However, a particularly expedient solution makes provision for the connection sleeve to be inserted into the bearing attachment piece from a side opposite the connection side.

It is particularly expedient for the connection sleeve to be supported by stop devices against movement in the direction of the connection side.

However, in order to hold the connection sleeve in this position it is also necessary to additionally fix the connection sleeve. Such a fixing could also be implemented by supplementary means such as, for example, a snap ring or a securing pin.

It is, however, particularly expedient for the connection sleeve to be held by the contact insert in a defined position relative to the bearing attachment piece against movement in the direction of the sensor head.

This can be implemented in a particularly simple way by the connection sleeve being acted upon by the protective sleeve of the contact insert.

By fixing the contact insert in the direction of the axis about which the bearing attachment piece is rotatable relative to the bearing body, both the connection sleeve and the contact insert can therefore be fixed in the direction of this axis in a simple way.

It is expedient for both the connection sleeve and the contact insert to be supported via the contact insert against movement in the direction away from the connection side.

This supporting is preferably implemented via the supporting flange.

A particularly advantageous solution makes provision for both the contact insert and the connection sleeve to be secured against movement away from the connection side by fixing the supporting flange on the sensor head side. A particularly expedient embodiment of the inventive solution makes provision for the sensor head to have a support which is connected to the bearing attachment piece and on which a sensor head housing is positionable in at least two positions having between them an angle of 180° which is determined relative to an axis of symmetry of the support extending at an incline to the axis of rotation of the bearing attachment piece. The sensor head is capable of orientation in two different directions, namely, on the one hand, a detection direction in the direction of the axis of rotation and, on the other hand, a detection direction transverse to the axis of rotation.

Very different possibilities are also conceivable for fixing the bearing attachment piece in the bearing opening.

A particularly expedient solution makes provision for the bearing attachment piece to have a circumferential securing groove with which a securing element fixable on the bearing body is engageable.

Such a securing groove thus allows securing of the bearing attachment piece against movement out of the bearing opening in the direction of the axis.

A wide range of possibilities is conceivable for fixing the bearing attachment piece in individual rotary positions relative to the bearing body. It is, for example, conceivable to provide toothings.

However, a particularly expedient solution makes provision for the bearing attachment piece to have flat areas which cooperate with fixing elements provided on the bearing body.

A particularly advantageous embodiment of such a fixing element makes provision for it to be designed as an adjustable pressure element which is advanceable in the direction of the flat area so as to non-rotatably fix the bearing attachment piece in the bearing opening.

As a supplement or alternative thereto, a further advantageous embodiment makes provision for the fixing element to be arranged on a detent spring element.

Such a detent spring element is preferably designed as a resilient detent tongue.

BRIEF DESCRIPTION OF THE DRAWINGS

Further features and advantages of the invention will be apparent from the following description and the appended drawings of an embodiment. In the drawings:

FIG. 10 is an enlarged section corresponding to FIG. 9 in the area of a contact insert.

DETAILED DESCRIPTION OF THE INVENTION

Figure 1:
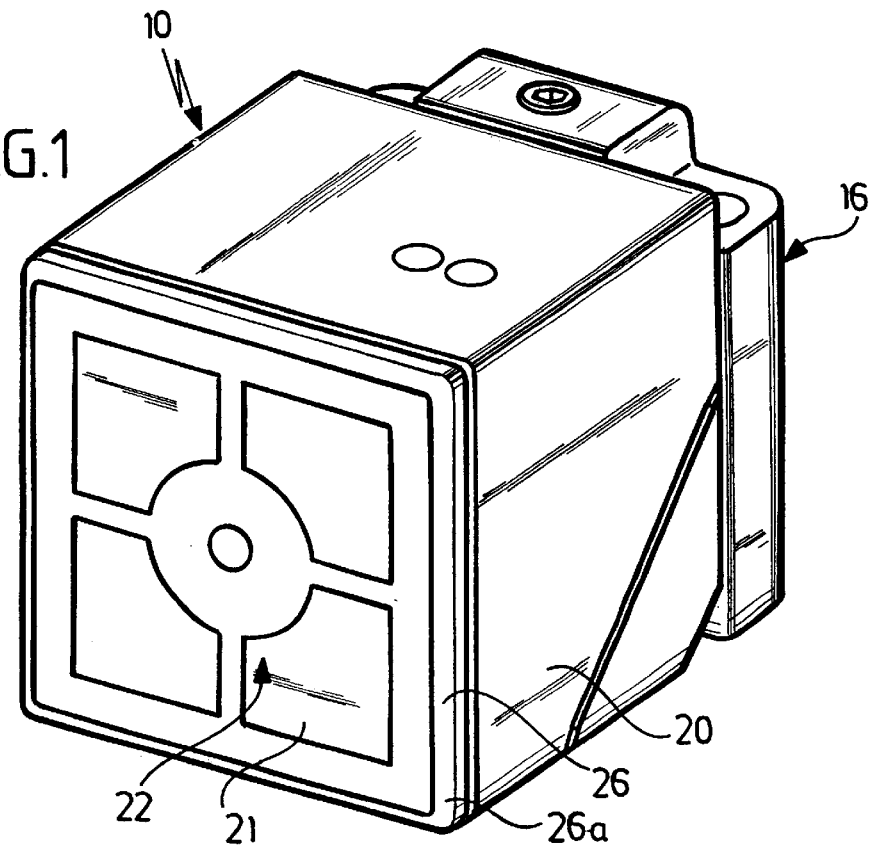
FIG. 1 is a view of an inventive proximity switch from a detector side.
Figure 2:
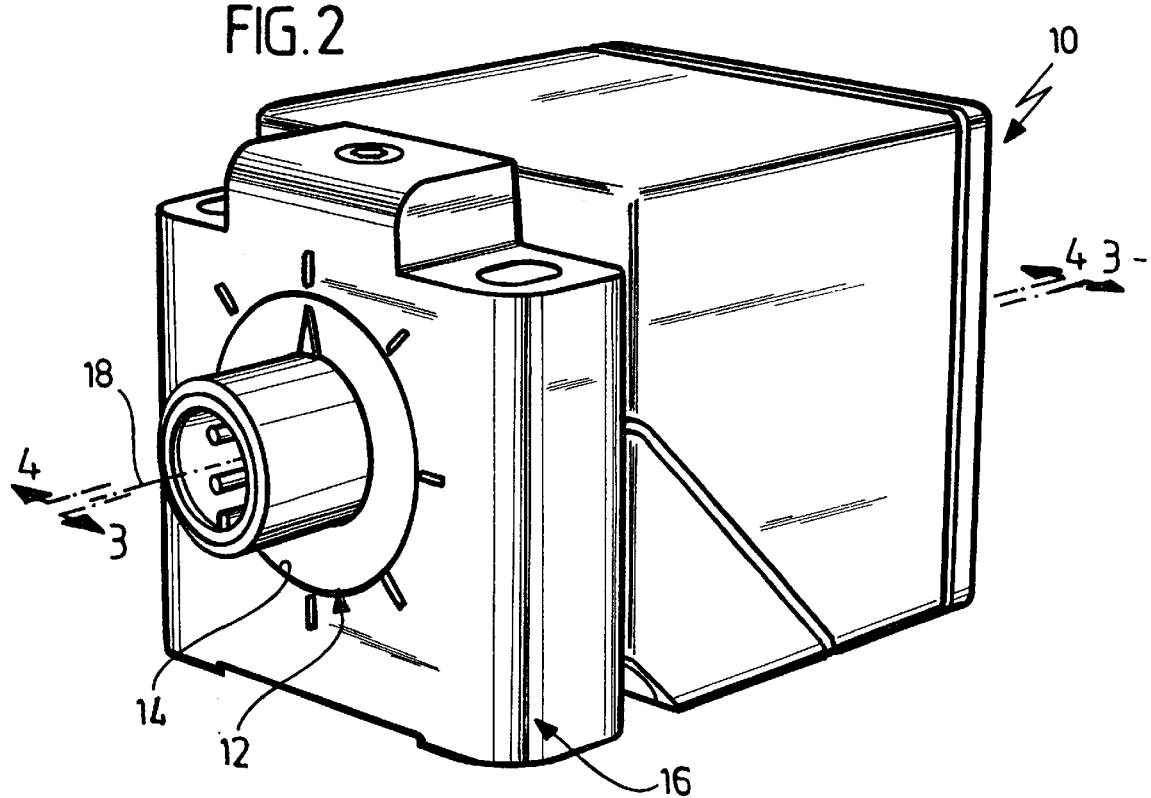
FIG. 2 is a perspective view of the inventive proximity switch from a bearing body side.

An embodiment of an inventive proximity switch, illustrated in its entirety in FIGS. 1 and 2, comprises a sensor head generally designated 10, on which a bearing attachment piece 12 is held, which, in turn, engages in a bearing opening 14 of a bearing body 16, which serves to fix the inventive proximity switch, for example, on a holder, while the sensor head 10 is mounted by the bearing attachment piece 12 in the bearing opening 14 for rotation about an axis 18 so as to enable positioning of the sensor head 10 in various rotary positions relative to the bearing body 16.

Figure 3:
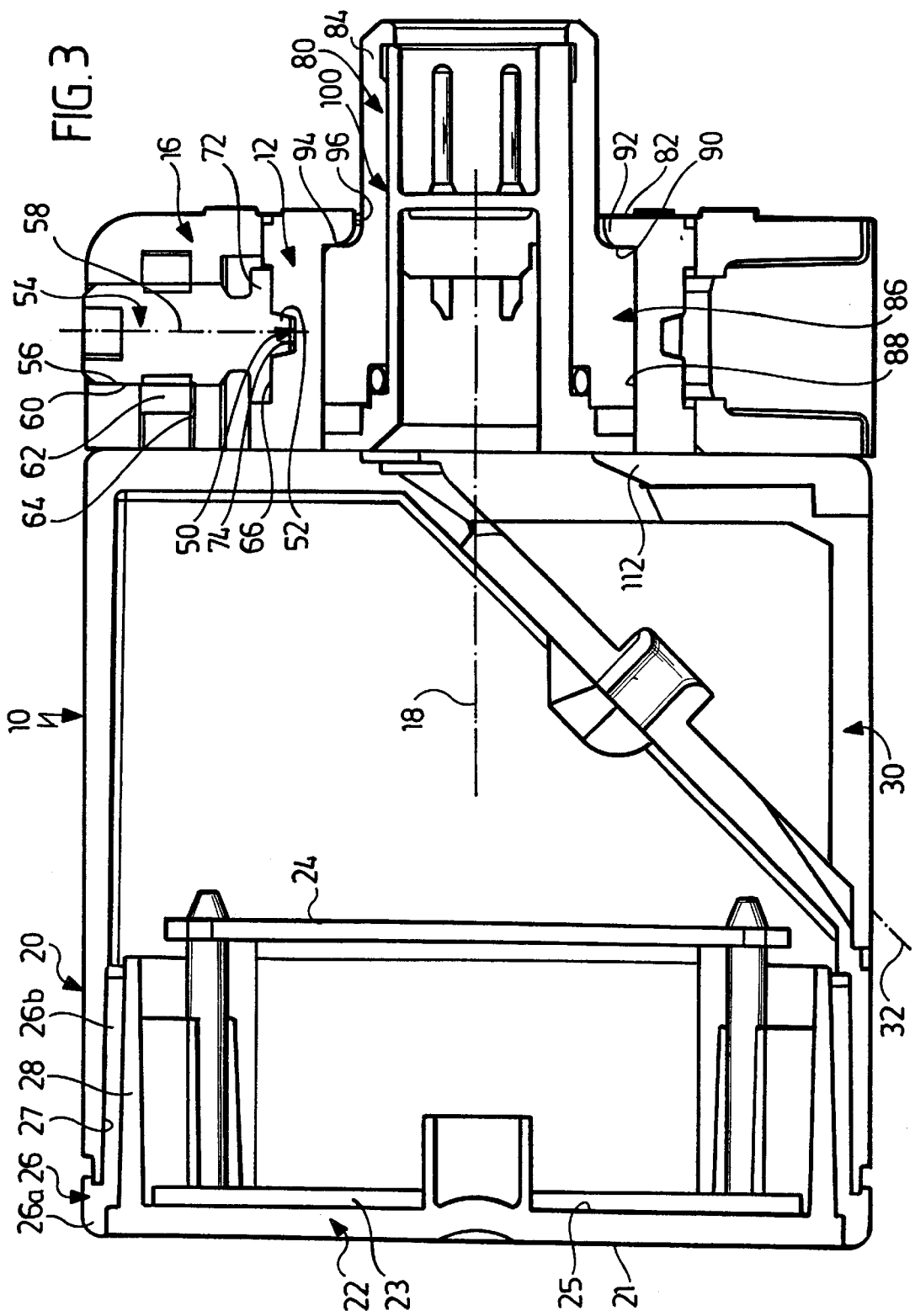
FIG. 3 is a section along line 3—3 in FIG. 2.
Figure 4:
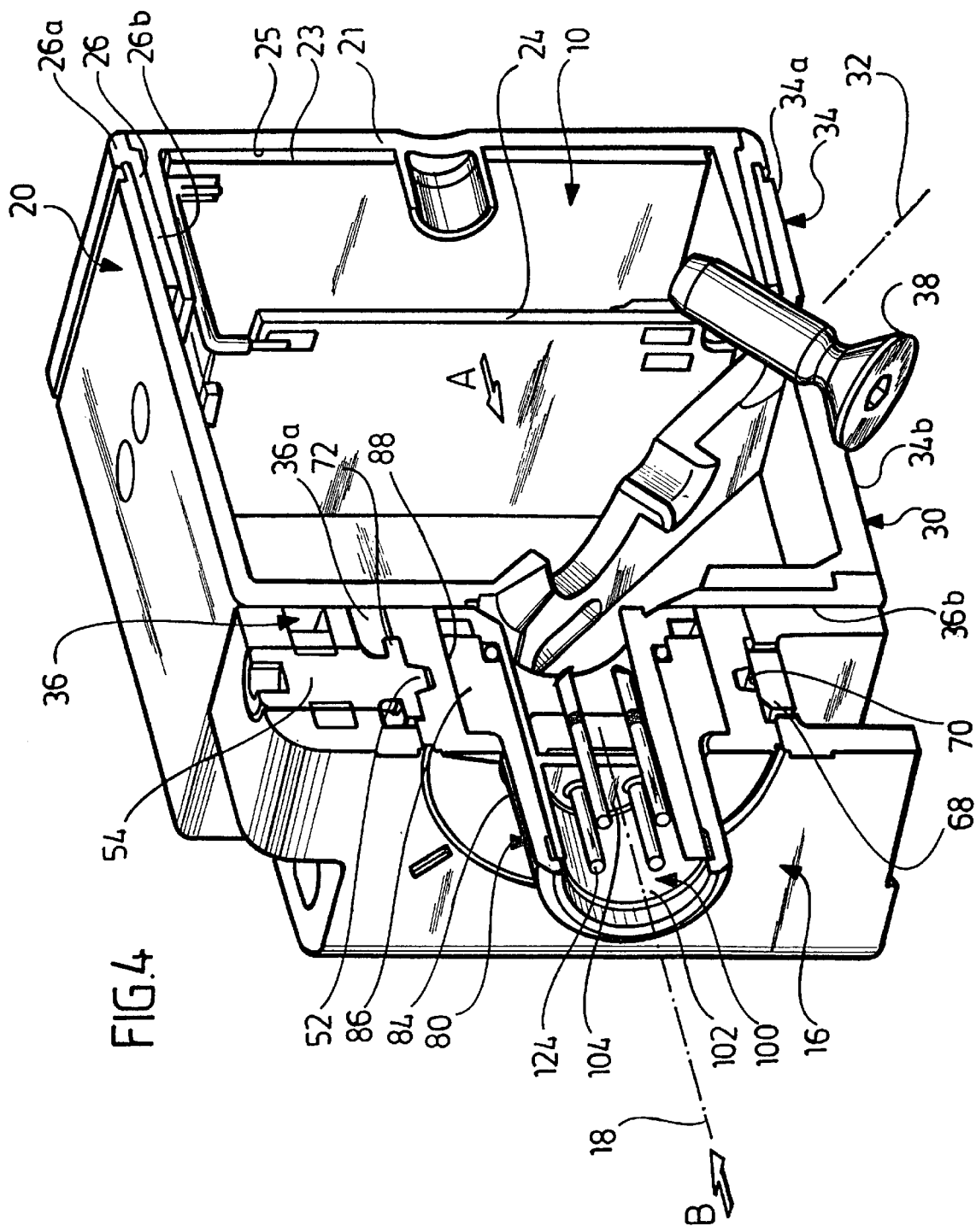
FIG. 4 is a perspective section along line 4—4 in FIG. 2.

As illustrated in detail in FIGS. 3 and 4, the sensor head 10 comprises a sensor housing generally designated 20 with a front insert 22 forming a front wall 21 and having arranged therein, for example, a sensor coil 23 and a sensor circuit 24 as sensor. The sensor circuit comprises, for example, an oscillator with the sensor coil 23 integrated into its oscillating circuit.

As illustrated in FIG. 3, the sensor coil 23 can be designed as a flat coil which rests against a rear side 25 of the front wall 21. It is, however, also conceivable to arrange the sensor coil 23 in a cup core which is likewise seated on the rear side 25 of the front wall.

When installing the sensor head 10 in a metallic environment, for example, an opening of a metal part, in order to avoid considerable influencing of the sensor coil 23, in particular, the course of its field through the sensor head 10, by surrounding metal, a screening ring 26 surrounding the sensor coil 23 is provided in the sensor head 10. The screening ring 26 is arranged between an insert opening 27 of the sensor housing 20 and an insert sleeve 28 of the front insert 22 engaging in the insert opening 27 and extends from an outer area 26a enclosing the front wall 21 in the direction of the axis 18 thereby enclosing the insert sleeve 28 with its inner area 26b so that the inner area 26b lies between the insert sleeve 28 of the front insert 22 and the insert opening 27, and the front insert 22 is preferably connected to the sensor housing 20 via the inner area 26b of the screening ring 26.

The screening ring 26 preferably encloses the entire front insert 22 and is adapted to the outer contour thereof, i.e., as is apparent from FIG. 1, it is designed as a frame of rectangular cross section enclosing the front insert 22.

The sensor housing 20 is seated on a turn support 30 and forms jointly with the turn support 30 preferably a cube-like body. The turn support 30 and the sensor housing 20 are separated by a dividing plane 32 which extends at an angle of 45° to two side surfaces 34 and 36 of the cube extending at a right angle to each other. The side surfaces 34 and 36 are divided by the same ratio by the dividing plane 32 so that one side surface area 34a, 36a each forms a wall surface of the sensor housing 20, while one side surface area 34b, 36b each forms a side surface of the turn support 30.

Figure 5:
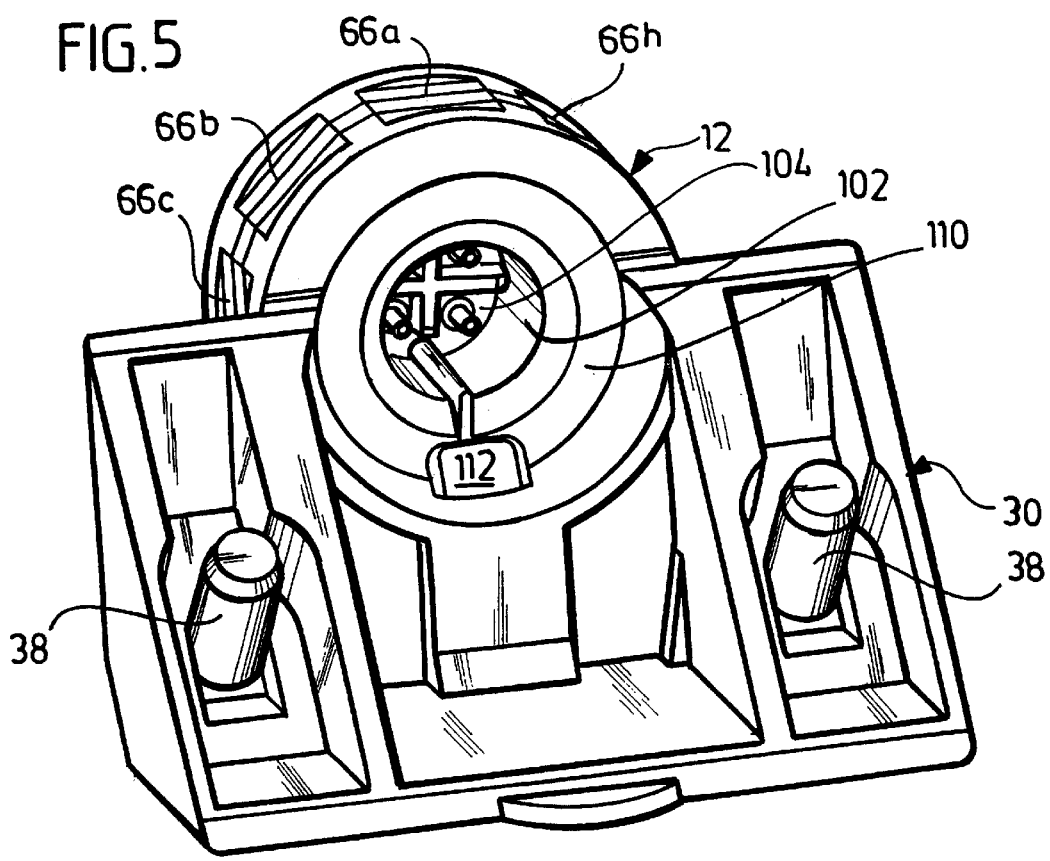
FIG. 5 is a view of bearing attachment piece and turn support in the direction of arrow A in FIG. 4.
Figure 6:
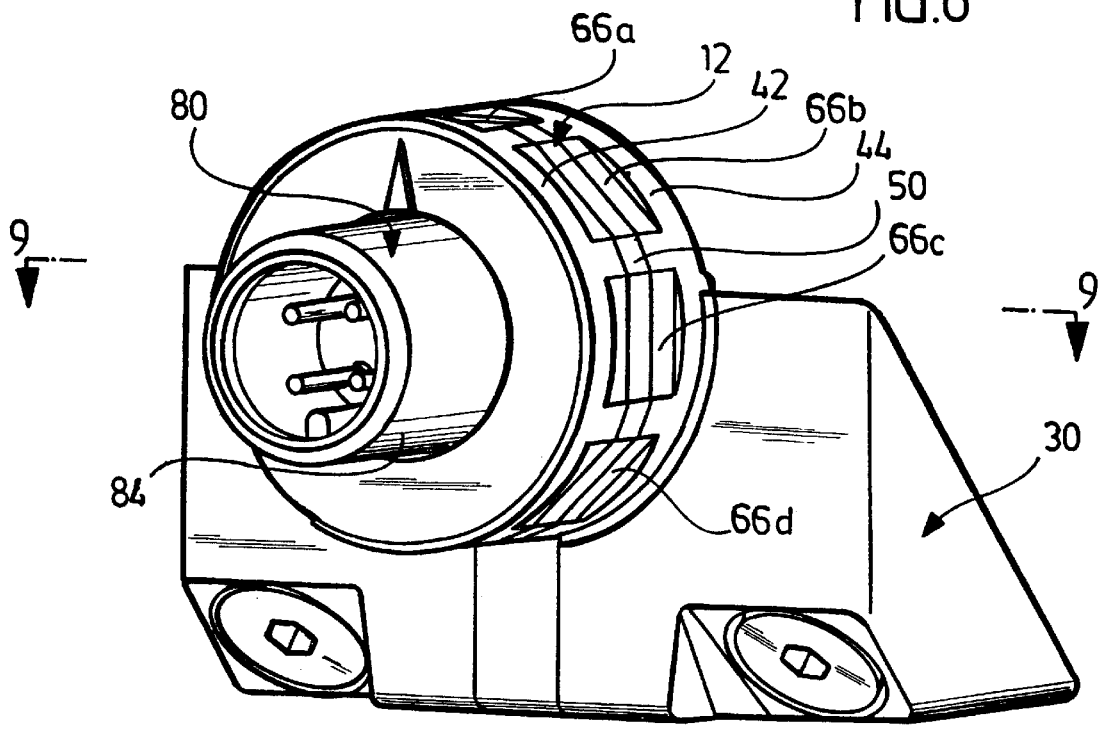
FIG. 6 is a view of bearing attachment piece and turn support in the direction of arrow B in FIG. 4.
Figure 7:
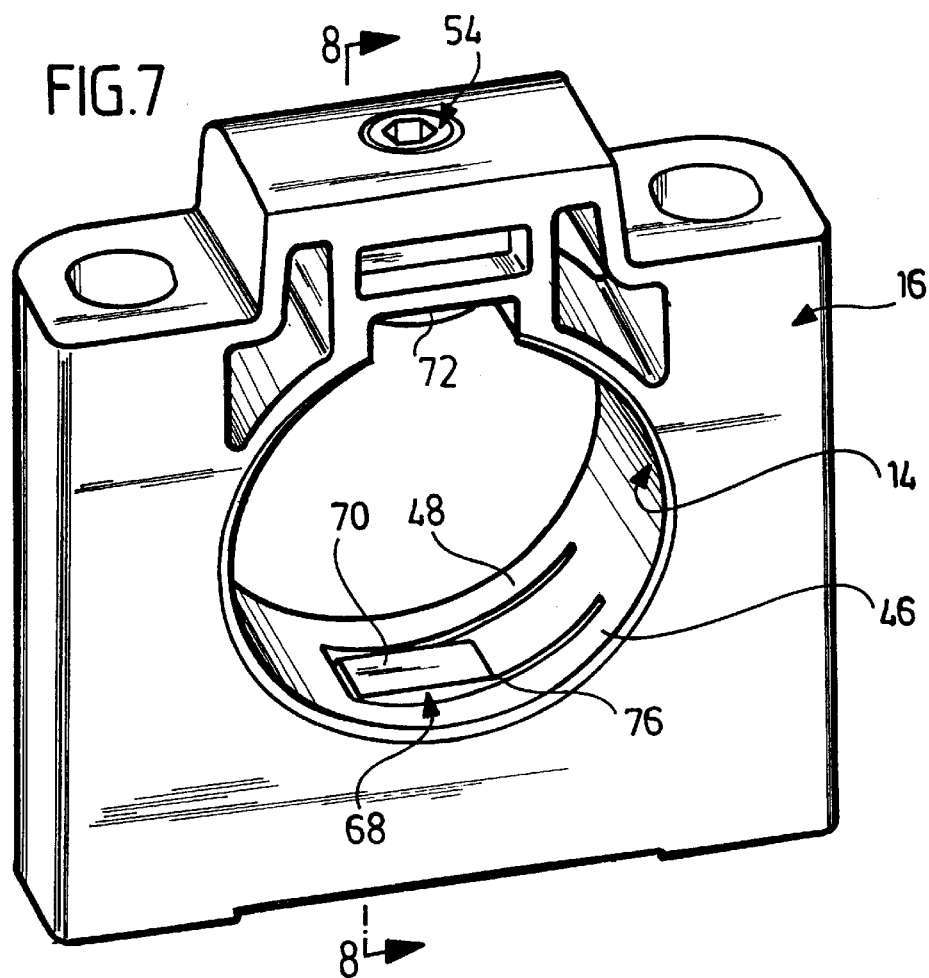
FIG. 7 is an illustration of a bearing body without the bearing attachment piece extending through the bearing opening.

As illustrated in FIGS. 5 and 6, the turn support 30 is fixedly connected to the bearing attachment piece 12 and preferably forms an integral part therewith.

The sensor housing 20 is positionable on the turn support 30 such that, as illustrated in FIG. 4, the sensor coil 23 lies in a plane extending transversely to the axis 18, or when the sensor housing 20 is turned through 180° and mounted on the turn support 30, it lies parallel to the axis 18.

For connection between the sensor housing 20 and the turn support 30, the turn support 30 is, for example, penetrated by two connecting elements 38 which are connectable to the sensor housing 20.

The bearing attachment piece 12 is mounted in the bearing body 16, as illustrated in FIGS. 3, 5 and 6, by two cylindrical lateral areas 42 and 44 extending rotationally symmetrically in relation to the axis 18. The cylindrical lateral areas 42 and 44 are arranged in spaced relation to each other on the bearing attachment piece 12 and rest against cylindrical guide surfaces 46 and 48 of the bearing opening 14 and are guided concentrically to the axis 18 by these.

Between the cylindrical lateral areas 42 and 44, preferably half way between these, there lies a securing groove 50 in which a securing nose 52 of a securing screw generally designated 54 engages. The securing screw 54 penetrates a guide channel 56 running transversely to the axis 18 through the bearing body 16 and with its longitudinal axis 58 preferably extends radially in relation to the axis 18.

With an outer thread 60 the securing screw 54 expediently engages in a retaining nut 62 arranged in a pocket 64 in the bearing body 16. The guide channel 56 passes through the pocket 64 which is open towards the sensor head 10.

When the securing screw 54 is turned in the direction of the bearing attachment piece 12 to such an extent that the securing nose 52 engages in the securing groove 50 of the bearing attachment piece 12, the bearing attachment piece 12 is then secured against movement in the direction of the axis 18 in the bearing opening 14 of the bearing body 16, and the cylindrical lateral areas 42 and 44 rest against the cylindrical guide surfaces 46 and 48, respectively.

For fixed presetting of individual rotary positions of the bearing attachment piece 12 relative to the bearing body 16, the bearing attachment piece 12 is provided, as illustrated by way of example in FIGS. 5 and 6, between the cylindrical lateral areas 42 and 44 with flat areas 66a to 66h extending on both sides of the securing groove. The flat areas 66a to 66h are arranged at identical angular spacings around the axis 18 and serve, for example, to preset a total of eight rotary positions.

These flat areas 66 correspond to a spring tongue 68 which is provided between the cylindrical guide surfaces 46 and 48 and has a locking surface 70 facing the bearing attachment piece 12. The locking surface 70 is acted upon in the direction of the axis 18 by the spring tongue 68 and is able to position itself against the flat areas 66 when these stand parallel to the locking surface 70. In this case, a light "locking" of the bearing attachment piece 12 in the corresponding rotary position occurs, whereas upon further turning of the bearing attachment piece 12, the spring tongue 68 must be moved with the locking surface 70 outwards and radially in relation to the axis 18 and so turning requires a counter torque to be overcome until the locking surface 70 again comes to rest against the next flat area 66.

Figure 8:
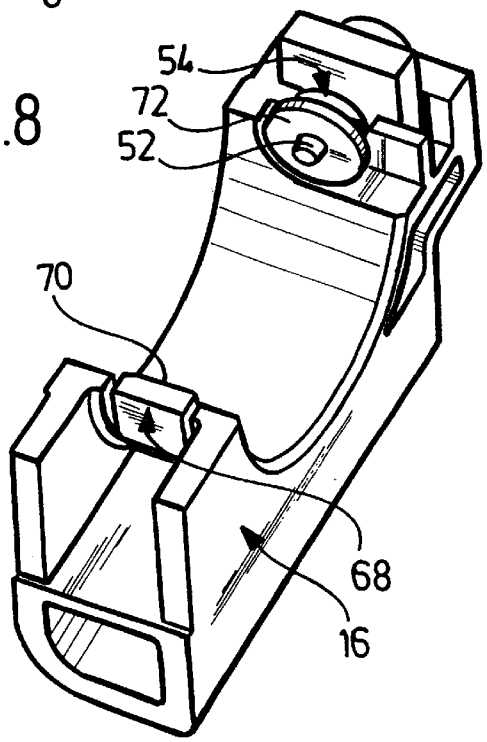
FIG. 8 is a section along line 8—8 in FIG. 7 in perspective illustration.

Furthermore, as illustrated, in particular, in FIG. 8, the securing screw 54 is also provided with a pressure plate 72 from which the securing nose 52 protrudes in the direction of the axis 18, and the securing nose 52 is of such dimensions that it does not rest against a groove bottom 74 of the securing groove 50 even when the pressure plate 72 rests on both sides of the securing groove 50 on a flat area 66 standing in a corresponding position.

By tightening the securing screw 54 it is therefore also possible to rotationally fixedly secure the bearing attachment piece 12 in the locked position which is already preset, for example, by the spring tongue 68 with the locking surface 70, via the pressure plate 72 which is positionable on the corresponding flat area 66 facing it, with the securing nose 52 engaging in the securing groove 50 without resting on the groove bottom 74 thereof, so that the pressure exerted by the securing screw 54 acts exclusively via the pressure plate 72 on the flat area 66 standing in a corresponding position.

The spring tongue 68 is preferably integrally formed on the bearing body 16 and movable relative to the bearing body 16 by the spring tongue 68 being surrounded by a, for example, U-shaped perforation 76 enclosing the spring tongue 68 which is thus releasably arranged relative to the remaining bearing body 16.

Figure 9:
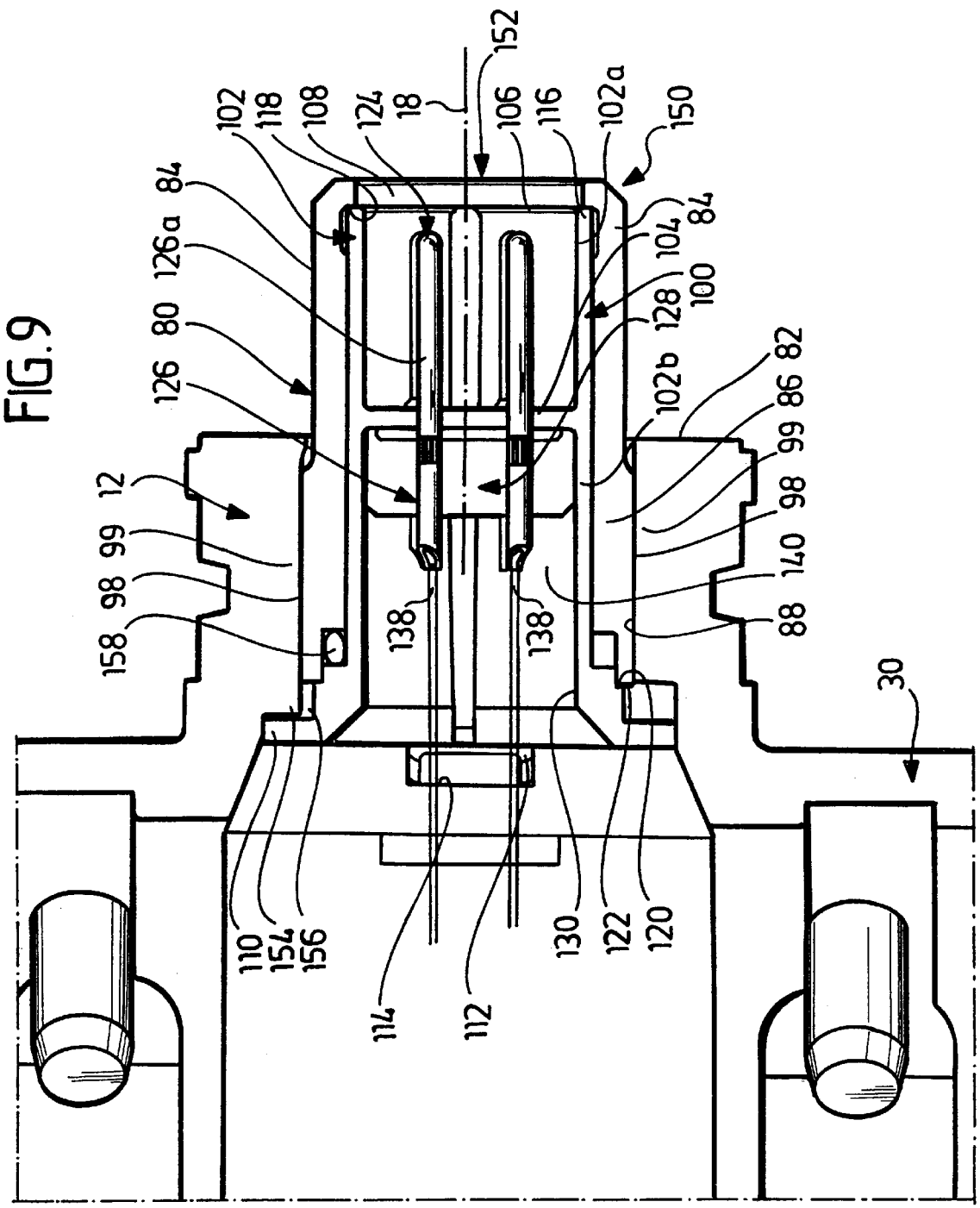
FIG. 9 is a enlarged illustration of a section along line 9—9 in FIG. 6.

Furthermore, as illustrated in FIGS. 3 and 9, a connection sleeve generally designated 80 is held in the bearing attachment piece 12. The connection sleeve 80 protrudes on an end face 82 of the bearing body 16 opposite the sensor head 10 and thus also the turn support 30 beyond the bearing body 16 with a threaded section 84 so that a coupling nut of a plug connector is screwable onto the threaded section 84.

The connection sleeve 80 lies, as illustrated in FIGS. 3 and 9, with its retaining section 86 in a central opening 88 within the bearing attachment piece 12, which has an adjoining annular flange 92 forming a step 90. The annular flange 92 lies between the opening 88 and the end face 82 of the bearing attachment piece 12 and forms with the step 90 a stop against which the retaining section 86, which expands radially at least section-wise relative to the threaded section, rests with a contact surface 94.

The connection sleeve 80 is thus insertable from the turn support 30 side into the bearing attachment piece 12, and the threaded section 84 of the connection sleeve 80 is pushable so far through an end face opening 96 of the annular flange 92, which is defined by the annular flange 92, that the retaining section 86 comes to rest with the contact surface 94 on the step 90.

Furthermore, the connection sleeve 80 is non-rotatably secured in the bearing attachment piece 12 preferably by the retaining section 86 having two flat sides 98 which are preferably located opposite each other and are non-rotatably secured in the bearing attachment piece 12 by wall areas 99 of the opening 88 which project in the direction of the axis 18.

There is located in the connection sleeve 80 a contact insert, generally designated 100, which, as illustrated in FIGS. 3, 4 and 9, comprises a protective sleeve 102 in which a contact base 104 is arranged as a contact support.

The protective sleeve 102 extends with a plug connection protective section 102a from the contact base 104 in the direction of its insert opening 106 which faces an insert opening 108 of the connection sleeve 80, which is arranged at an end of the threaded section 84 of the connection sleeve 80 facing away from the retaining section 86.

Furthermore, the protective sleeve 102 extends with a cable connection protective section 102b from the contact base 104 in the direction of the sensor head 10 as far as a supporting flange 110 which extends radially outwardly in relation to a cylindrical shape of the protective sleeve 102.

The supporting flange 110 is, as illustrated in FIGS. 3, 5 and 9, secured by a securing wedge 112 which is releasably insertable into a wedge support 114 provided therefor in the turn support 30.

Furthermore, when the sensor housing 20 is placed on the turn support 30, the supporting flange 110 is supported on the wall area of the sensor housing 20 facing the bearing body 16, for example, the wall area 36a, in the position of the sensor housing 20 shown in FIG. 4.

The contact insert 100 is therefore also insertable from the sensor head 10 side into the bearing attachment piece 12 and, in particular, into the connection sleeve 80, more specifically, until the protective sleeve 102 rests with its end face 116 against an annular surface 118 surrounding the insert opening 108 of the connection sleeve 80 as stop surface.

At the same time, the protective sleeve 102 is provided near the supporting flange 110 with a step 120 extending in the shape of a ring and resting against a rear end face 122 of the connection sleeve 80 when the protective sleeve 102 rests with the end face 116 against the annular surface 118.

Thus by fixing the axial position of the contact insert 100 via the securing wedge 112 which acts upon the supporting flange 110, the connection sleeve 80 is also simultaneously secured against movement in the direction of the sensor head 10, while, at the same time, the protective sleeve 102 and the connection sleeve 80 are displaced at such a distance away from the sensor head 10 in the direction of the axis 18 that the connection sleeve 80 rests by way of the contact surface 94 against the step 90 of the bearing attachment piece 12 and, at the same time, on account of its acting upon the connection sleeve 80, the protective sleeve 102 holds the connection sleeve 80 in this position relative to the bearing attachment piece 12.

The contact base 104 is also provided with contact pin openings 124 which are penetrated by contact pins 126 with their plug connection sections 126a extending in the direction of the insert opening 106 (FIGS. 9 and 10).

The contact pins 126 are, in turn, held in a contact pin carrier generally designated 128, which is insertable from the supporting flange 110 side into a central opening 130 of the protective sleeve 102 extending from the supporting flange 110 to the contact base 104 in order to push the contact pins 126 with their plug connection sections 126a through the contact pin openings 124.

The contact pins 126 are firmly connected to the contact pin carrier 128 which in the position fully inserted in the protective sleeve 102 rests with a front side 132 against a rear side 134 of the contact base 104.

The contact pin openings 124 are preferably also provided with lip-shaped lugs 136 which are so designed that when pushing through the plug connection sections 126a of the contact pins 126 they are radially widened and so tightly enclose the plug connection sections 126a of the contact pins 126 and consequently rest sealingly against these.

The contact pins 126 are also provided with cable connection sections 126b which rise from the contact pin carrier 128 on a side opposite the plug connection sections 126a above the contact pin carrier 128 and extend in the direction of the supporting flange 110 when the contact pin carrier 128 is inserted in the protective sleeve 102.

The cable connection sections 126b are preferably soldered to cable ends 138 prior to insertion of the contact pin carrier 128 into the protective sleeve 102, and after insertion of the contact pin carrier 128 a casting of the contact pin carrier 128 in the protective sleeve 102 is carried out in such a way that the opening 130 is filled with a molding compound 140 to such an extent that the cable ends 138 in the area of their soldered connection to the cable connection sections 126b and the entire cable connection sections 126b are embedded in the molding compound 140 which also covers the entire contact pin carrier 128 and extends outwards as far as the protective sleeve 102.

An absolutely tight closure between the contact pins 126 and the protective sleeve 102 is thereby achieved.

The protective sleeve 102, the contact base 104 and the contact pin insert 128 with the contact pins 126 thus form as a whole the contact insert 100, which, as described above, is rotatable within the connection sleeve 80.

Furthermore, the contact insert 100 and the connection sleeve 80 form as a whole a plug connection, generally designated 150, whose connection side 152 is defined by the insert openings 108 and 106 and the plug connection sections 126a of the contact pins 126, and this connection side 152 is located on a side of the bearing attachment piece 12 located opposite the sensor head 10.

In the inventive solution, the entire contact insert 100 is preferably mounted in the connection sleeve 80, which is non-rotatably held in the bearing attachment piece 12, for rotation about the axis 18 and hence coaxially with the bearing attachment piece 12, so that upon placing a plug connector on the connection side 152 a contact socket can be inserted into the insert openings 108 and 106 and brought into operative connection with the plug connection sections 126a of the contact pins 126.

The plug connector can be turned with the cable leading away from it so long as the cable leads away from the plug connection 150 with a favorable orientation, and, at the same time, the entire contact insert 100 is rotatable along with it within the connection sleeve 80, while the connection sleeve 80 is non-rotatably held in the bearing attachment piece 12 and so once the contact insert 100 has been aligned in the desired direction, it is possible to tighten the coupling nut, whose internal thread engages over the threaded section 84 of the connection sleeve 80, without a torque acting upon the contact insert 100 mounted for rotation in the connection sleeve 80.

Merely to avoid an unlimited rotation of the contact insert 100 in the bearing attachment piece 12 and hence in the connection sleeve 80, in an area lying close to the supporting flange 110 when the protective sleeve 102 is inserted, the bearing attachment piece 12 is provided with a radially projecting nose 154, on whose oppositely located sides a nose 156 arranged on an outer side of the protective sleeve 102 close to the supporting flange 110 can be positioned in two end positions spaced from each other by an angular distance of less than 360°, so that a maximum rotation of the contact insert 100 relative to the bearing attachment piece 12 through the distance between the two rotary positions, i.e., through an angle of less than 360°, is possible.

Furthermore, in order to obtain a tight closure between the protective sleeve 102 and the connection sleeve 80, an O-ring 158 which is effective between these two is provided close to the step 120.

I claim:

1. Proximity switch, comprising:
   a bearing body with a bearing opening,
   a sensor head having a proximity sensor with a sensor circuit arranged therein,
   a bearing attachment piece held on the sensor head and mounted in the bearing opening for rotation about an axis, and
   a plug connection having a connection side arranged on a side of the bearing attachment piece opposite the sensor head and comprising a connection sleeve and a contact insert arranged in the connection sleeve,
   wherein:
   the connection sleeve is non-rotatably held in the bearing attachment piece,
   the contact insert is mounted in the connection sleeve for rotation relative thereto, and
   the contact insert is inserted into the connection sleeve from a side opposite the connection side.

2. Proximity switch in accordance with claim 1, wherein the contact insert is rotatable to a limited extent relative to the connection sleeve.

3. Proximity switch in accordance with claim 1, wherein the contact insert comprises a protective sleeve which extends from a contact support in directions opposite to one another.

4. Proximity switch in accordance with claim 3, wherein the protective sleeve forms a plug connection protective section which encloses plug connection sections starting from the contact support.

5. Proximity switch in accordance with claim 3, wherein the protective sleeve comprises a cable connection protective section which encloses cable connection sections.

6. Proximity switch in accordance with claim 3, wherein the protective sleeve extends substantially over the entire extent of the connection sleeve in the direction of said axis.

7. Proximity switch in accordance with claim 1, wherein the contact insert is supported on the connection sleeve via a protective sleeve.

8. Proximity switch in accordance with claim 1, wherein the contact insert is supported on the connection sleeve against movement in the direction of the connection side.

9. Proximity switch in accordance with claim 8, wherein the contact insert is provided with a supporting flange which is supported on the sensor head against movement in the direction of the sensor head.

10. Proximity switch in accordance with claim 1, wherein the connection sleeve is a separate part inserted into the bearing attachment piece.

11. Proximity switch in accordance with claim 10, wherein the connection sleeve is inserted into the bearing attachment piece from a side opposite the connection side.

12. Proximity switch in accordance with claim 11, wherein the connection sleeve is supported by stop devices against movement in the direction of the connection side.

13. Proximity switch in accordance with claim 11, wherein the connection sleeve is held by the contact insert in a defined position relative to the bearing attachment piece against movement in the direction of the sensor head.

14. Proximity switch in accordance with claim 1, wherein the contact insert comprises a protective sleeve having a contact support integrally formed thereon.

15. Proximity switch in accordance with claim 14, wherein a contact pin carrier having contact pins is insertable into the protective sleeve.

16. Proximity switch in accordance with claim 14, wherein the contact support comprises contact pin openings for passage of the contact pins therethrough.

17. Proximity switch in accordance with claim 1, wherein the bearing attachment piece comprises a circumferential securing groove with which a securing element fixable on the bearing body is engageable.

18. Proximity switch in accordance with claim 1, wherein the bearing attachment piece is non-rotatably fixable in the bearing body.

19. Proximity switch in accordance with claim 1, wherein the bearing attachment piece is provided with flat areas which cooperate with fixing elements provided on the bearing body.

20. Proximity switch in accordance with claim 19, wherein the fixing element is designed as an adjustable pressure element which is advanceable in the direction of the flat area so as to non-rotatably fix the bearing attachment piece in the bearing opening of the bearing body.

21. Proximity switch in accordance with claim 19, wherein the fixing element is arranged on a detent spring element.

22. Proximity switch, comprising:
   a bearing body with a bearing opening,
   a sensor head having a proximity sensor with a sensor circuit arranged therein,
   a bearing attachment piece held on the sensor head and mounted in the bearing opening for rotation about an axis, and
   a plug connection having a connection side arranged on a side of the bearing attachment piece opposite the sensor head and comprising a connection sleeve and a contact insert arranged in the connection sleeve,
   wherein:
   the connection sleeve is non-rotatably held in the bearing attachment piece,
   the contact insert is mounted in the connection sleeve for rotation relative thereto, and
   the connection sleeve is a separate part inserted into the bearing attachment piece from a side opposite the connection side.

* * * * *